United States Patent
Ishida et al.

(10) Patent No.: US 10,067,242 B2
(45) Date of Patent: Sep. 4, 2018

(54) SCINTILLATOR, METHOD OF MANUFACTURING THE SAME, RADIATION IMAGING APPARATUS, AND RADIATION IMAGING SYSTEM

(71) Applicant: CANON KABUSHIKI KAISHA, Tokyo (JP)

(72) Inventors: Yohei Ishida, Kawasaki (JP); Tamaki Kobayashi, Isehara (JP); Tomoaki Ichimura, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/221,857

(22) Filed: Jul. 28, 2016

(65) Prior Publication Data
US 2017/0038482 A1   Feb. 9, 2017

(30) Foreign Application Priority Data
Aug. 6, 2015   (JP) .................................. 2015-156239

(51) Int. Cl.
*G01T 1/20* (2006.01)
*C30B 25/02* (2006.01)
(Continued)

(52) U.S. Cl.
CPC ............ *G01T 1/2018* (2013.01); *C30B 25/02* (2013.01); *C30B 29/12* (2013.01); *C30B 29/605* (2013.01); *C30B 33/00* (2013.01); *G01T 1/202* (2013.01)

(58) Field of Classification Search
CPC ......... G01T 1/202; G01T 1/2018; G01T 1/20; G02B 1/14; C30B 25/02; C30B 29/12; C30B 29/605; C30B 33/00
(Continued)

(56) References Cited

U.S. PATENT DOCUMENTS 7,087,908 B2   8/2006 Homme
7,514,686 B2   4/2009 Ogawa et al.
(Continued)

FOREIGN PATENT DOCUMENTS

CN   1455877 A   11/2003
CN   1809762 A   7/2006
(Continued)

OTHER PUBLICATIONS

First Office Action in Chinese Application No. 201610615540.X (dated Jun. 7, 2018).

*Primary Examiner* — Taeho Jo
(74) *Attorney, Agent, or Firm* — Fitzpatrick, Cella, Harper & Scinto

(57) ABSTRACT

A method of manufacturing a scintillator, includes growing a scintillator layer constituted by a plurality of column crystals on a base, forming a first protection film so as to cover the scintillator layer, planarizing the first protection film, the planarizing including a polishing process of polishing the first protection film, and forming a second protection film configured to cover the first protection film that has undergone the planarizing. The scintillator layers grown on the base include an abnormally grown portion. In the polishing process, a front end of the abnormally grown portion is polished as well as a surface of the first protection film so as to form a continuation surface by the surface of the first protection film and a surface of the abnormally grown portion.

14 Claims, 7 Drawing Sheets

(51) Int. Cl.
*C30B 29/12* (2006.01)
*C30B 29/60* (2006.01)
*C30B 33/00* (2006.01)
*G01T 1/202* (2006.01)

(58) Field of Classification Search
USPC .......................................................... 250/366
See application file for complete search history.

(56) References Cited

U.S. PATENT DOCUMENTS

| | | | |
|---|---|---|---|
| 8,779,369 B2 | 7/2014 | Ichimura et al. | |
| 2002/0121606 A1* | 9/2002 | Okada | G01T 1/2018 250/370.11 |
| 2005/0035298 A1* | 2/2005 | Okada | G01T 1/2018 250/370.11 |
| 2007/0051896 A1* | 3/2007 | Okada | G01T 1/2018 250/370.11 |
| 2011/0017912 A1* | 1/2011 | Goto | C09K 11/628 250/361 R |
| 2012/0187299 A1* | 7/2012 | Nagano | H01L 27/14663 250/361 R |
| 2012/0217404 A1* | 8/2012 | Iwakiri | G01T 1/202 250/361 R |
| 2012/0288688 A1 | 11/2012 | Kug et al. | |
| 2013/0019462 A1* | 1/2013 | Shoji | G01T 1/2018 29/595 |
| 2014/0175295 A1* | 6/2014 | Takei | G01T 1/202 250/366 |
| 2014/0239196 A1* | 8/2014 | Shoji | G01T 1/202 250/488.1 |
| 2015/0014546 A1* | 1/2015 | Ichimura | G01T 1/202 250/367 |
| 2016/0202362 A1 | 7/2016 | Ichimura | |

FOREIGN PATENT DOCUMENTS

| | | |
|---|---|---|
| CN | 101002110 A | 7/2007 |
| CN | 102779565 A | 11/2012 |
| CN | 103885079 A | 6/2014 |
| JP | 2004-333381 A | 11/2004 |
| JP | 2005-337962 A | 12/2005 |
| JP | 2006-335887 A | 12/2006 |
| JP | 2010-025620 A | 2/2010 |
| JP | 4800434 B2 | 10/2011 |

* cited by examiner

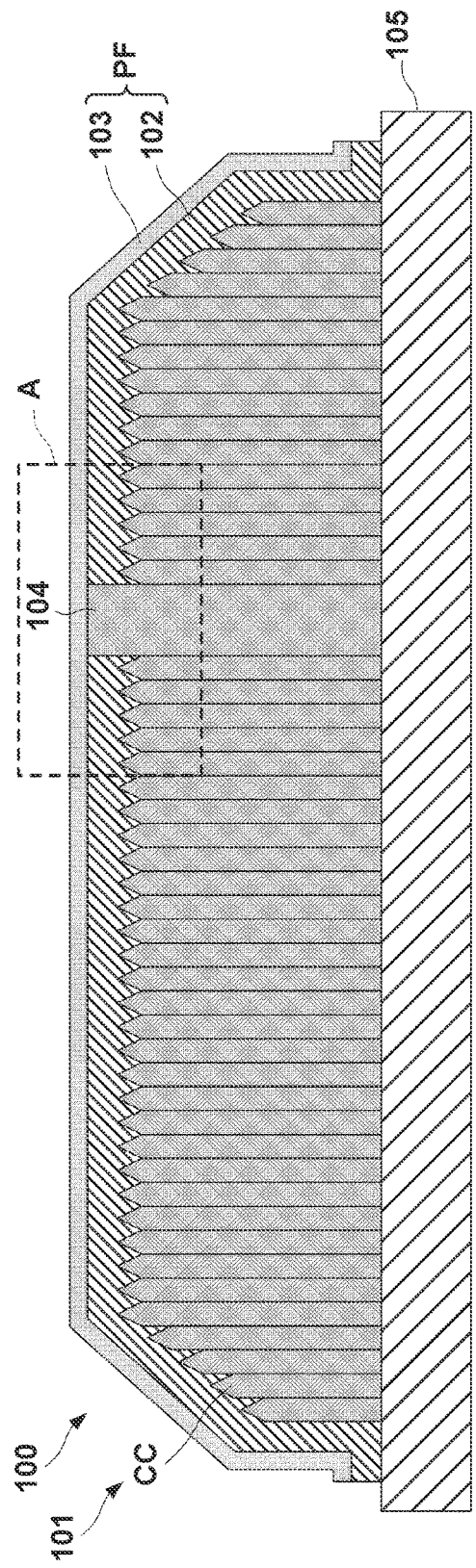
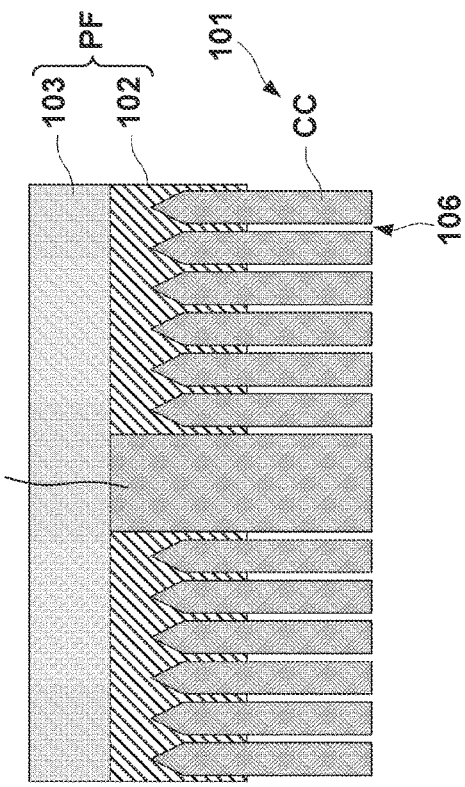
FIG. 1A
FIG. 1B

FIG. 2
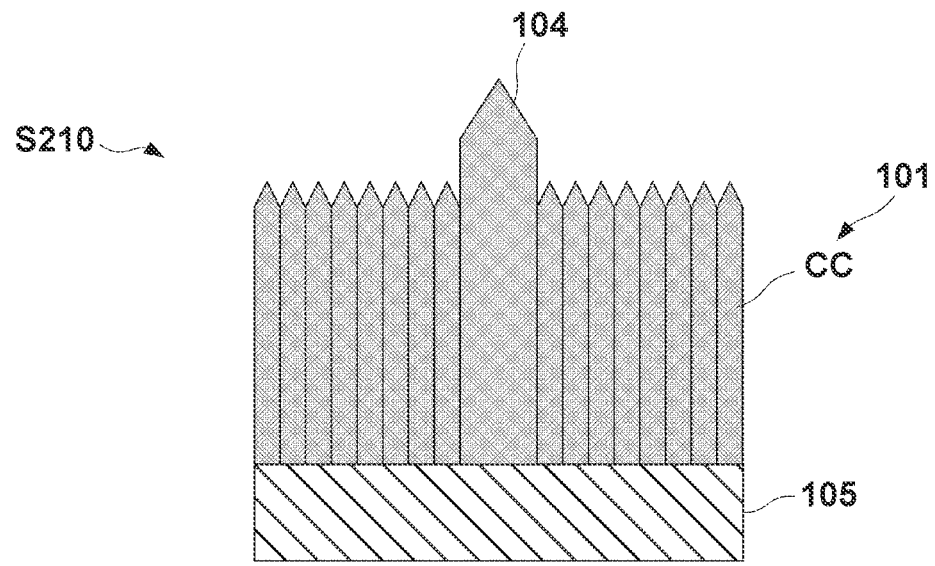
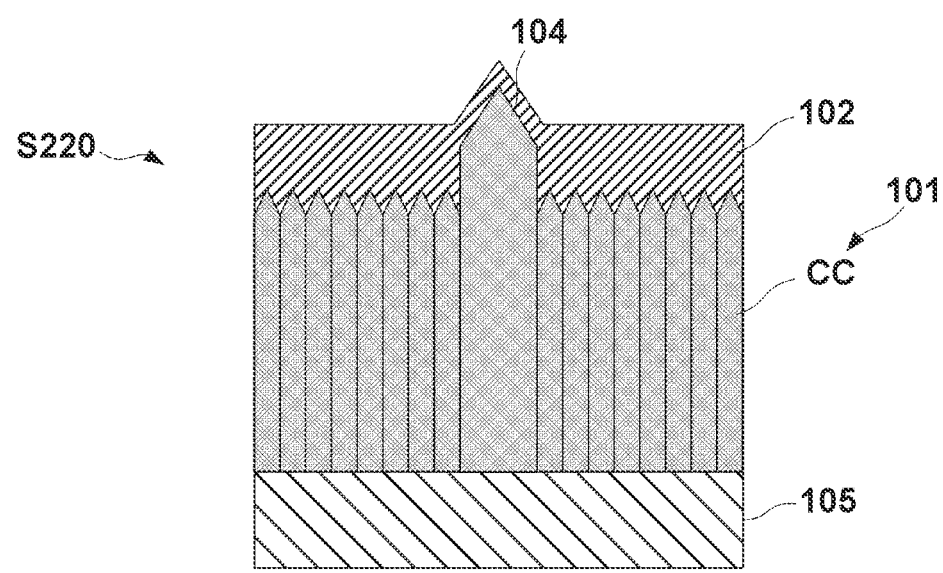

SCINTILLATOR, METHOD OF MANUFACTURING THE SAME, RADIATION IMAGING APPARATUS, AND RADIATION IMAGING SYSTEM

BACKGROUND OF THE INVENTION

Field of the Invention

The present invention relates to a scintillator, a method of manufacturing the same, a radiation imaging apparatus, and a radiation imaging system.

Description of the Related Art

A scintillator can be manufactured by, for example, growing a plurality of columnar crystals on a base. In manufacturing the scintillator, columnar crystals may grow abnormally. A portion formed by abnormal growth can be referred to as, for example, an abnormally grown portion. The abnormally grown portion becomes higher than another portion and constitutes a portion that protrudes more than the other portion on the surface of a scintillator layer. Therefore, when the scintillator including the abnormally grown portion is bonded to a sensor array in which a plurality of sensors (photoelectric conversion portions) are arrayed, a considerable interspace needs to be provided between the scintillator and the sensor array. However, such an arrangement can be a cause of decreasing Detective Quantum Efficiency (DQE) and Modulation Transfer Function (MTF).

Japanese Patent No. 4800434 describes a method of forming a columnar crystal of CsI as a scintillator by vapor deposition, and then placing a glass plate on the surface of CsI including an abnormally grown portion and applying 1 atmospheric pressure to CsI in order to planarize the surface. Japanese Patent Laid Open No. 2010-25620 does not mention abnormal growth. However, this literature describes a method of forming a plurality of fluorescent columnar crystals, and then covering the front end portions thereof with a material having a refractive index lower than that of each crystal and polishing a layer made of the plurality of fluorescent columnar crystals and the material having the lower refractive index. Executing the method described in Japanese Patent Laid Open No. 2010-25620, it is understood that an abnormally grown portion can be polished if it exists.

In the method described in Japanese Patent No. 4800434, the scintillator may be damaged by applying the pressure to the abnormally grown portion and a portion other than this. Therefore, it can be difficult to increase a yield rate, increasing a manufacturing cost. In the method described in patent Japanese Patent Laid Open No. 2010-25620, all the fluorescent columnar crystals can be exposed by polishing, and thus deteriorated by water. That is, it may be difficult to obtain a high-quality scintillator at a low cost with the methods described in Japanese Patent No. 4800434 and Japanese Patent Laid Open No. 2010-25620.

SUMMARY OF THE INVENTION

The present invention provides a technique advantageous in manufacturing a high-quality scintillator with a low cost even if an abnormally grown portion is generated in a scintillator layer.

One of aspects of the present invention provides a method of manufacturing a scintillator, the method comprising: growing a scintillator layer constituted by a plurality of column crystals on a base; forming a first protection film so as to cover the scintillator layer; planarizing the first protection film, the planarizing including a polishing process of polishing the first protection film; and forming a second protection film configured to cover the first protection film that has undergone the planarizing, wherein the scintillator layers grown on the base include an abnormally grown portion, and in the polishing process, a front end of the abnormally grown portion is polished as well as a surface of the first protection film so as to form a continuation surface by the surface of the first protection film and a surface of the abnormally grown portion.

Further features of the present invention will become apparent from the following description of exemplary embodiments (with reference to the attached drawings).

BRIEF DESCRIPTION OF THE DRAWINGS

FIGS. 1A and 1B are views each schematically showing the sectional arrangement of a scintillator according to one embodiment of the present invention;

FIG. 2 shows views for explaining a method of manufacturing the scintillator according to the first and second embodiments of the present invention;

DESCRIPTION OF THE EMBODIMENTS

Figure 3:
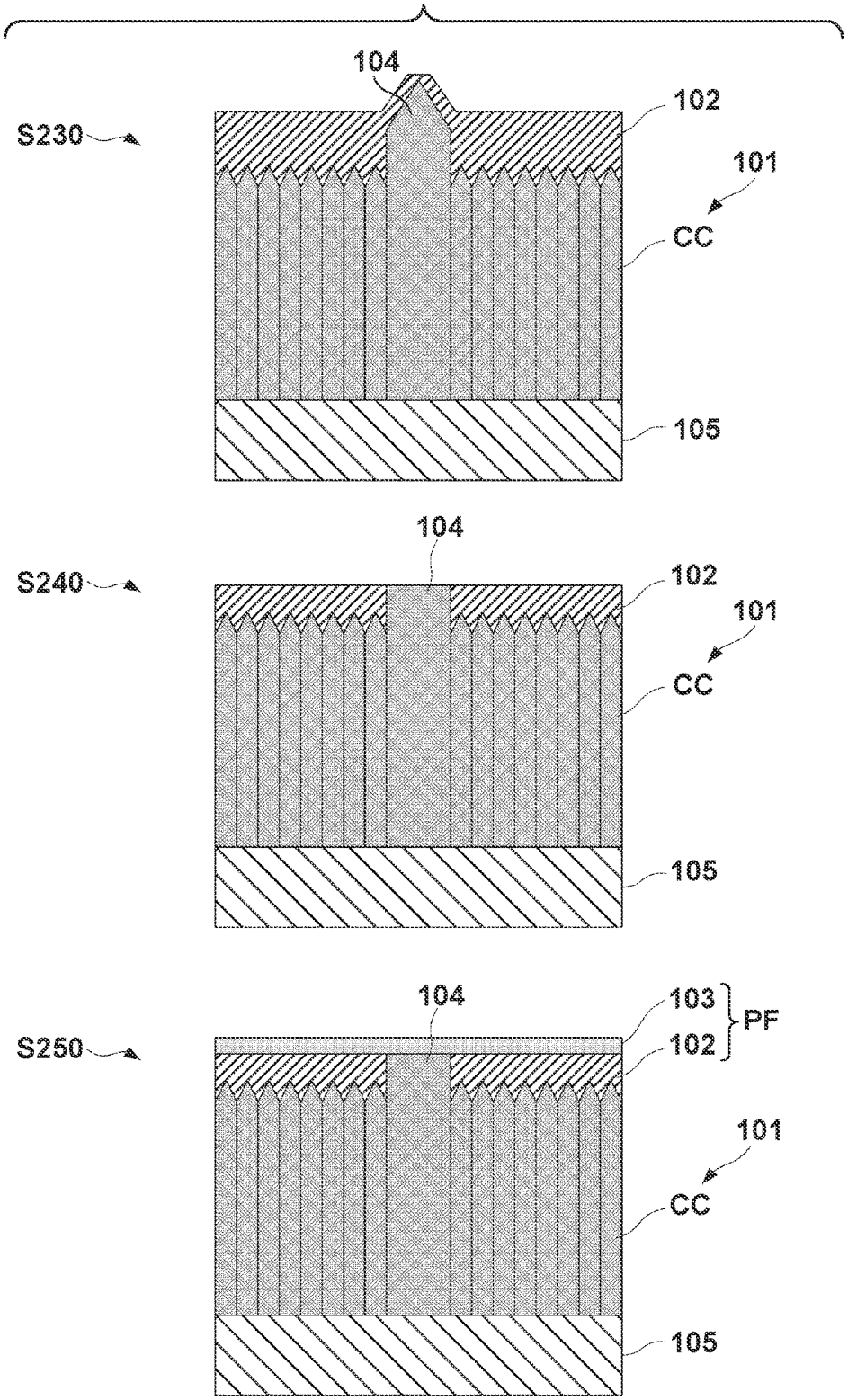
FIG. 3 shows views for explaining the method of manufacturing the scintillator according to the first embodiment of the present invention.

Exemplary embodiments of the present invention will be described below with reference to the accompanying drawings.

FIG. 1A is a schematic view showing the sectional arrangement of a scintillator 100 according to one embodiment of the present invention. FIG. 1B is an enlarged schematic view of a portion A in FIG. 1A. The scintillator 100 converts radiation into light such as visible light. The term radiation includes, for example, X-rays, α-rays, β-rays, γ-rays, and the like.

The scintillator 100 includes a scintillator layer 101 constituted by a plurality of columnar crystals CC and a protection film PF covering the scintillator layer 101. The protection film PF can include a first protection film 102 which covers the scintillator layer 101 and a second protection film 103 which covers the first protection film 102. The scintillator layer 101 can be constituted by, for example, cesium iodide (CsI) as a main component. As an activator agent, for example, thallium (Tl), sodium (Na), or the like can be added to cesium iodide. By adding the activator agent, cesium iodide can emit visible light. For example, the scintillator layer 101 may be constituted by a material containing alkali halide as a main component or may be constituted by another material as a main component. The scintillator layer 101 can include an abnormally grown portion 104. The abnormally grown portion 104 can also contain the columnar crystals. However, while the columnar crystals CC of a normal portion (normally grown portion) in the scintillator layer 101 have a regular array, the abnormally grown portion 104 can be formed so as to disturb its regular array.

As schematically shown in FIG. 1B, an interspace 106 can exist between the columnar crystal CC and the columnar crystal CC, which constitute the scintillator layer 101. The filling factor of the scintillator layer 101 becomes lower as a ratio of the interspaces 106 to the scintillator layer 101 becomes higher. Letting $\rho$(g/cm$^3$) be a density of each scintillator layer 101, and $p_c$(g/cm$^3$) be a density of the material of the scintillator layer 101 in a single crystal state, the filling factor of $0.5 \leq \rho/p_c \leq 0.8$ is preferably obtained. The density p of each scintillator layer 101 is a value obtained by dividing the density of an aggregate of the plurality of columnar crystals CC that constitute the scintillator layer 101, that is, the mass (g) of scintillator layer 101 by the volume (bottom area×thickness) (cm$^3$) of the scintillator layer 101.

Assume that scintillator layer 101 has a constant thickness. In this case, when the filling factor becomes lower, Modulation Transfer Function (MTF) of the scintillator layer 101 (or the scintillator 100) increases, but Detective Quantum Efficiency (DQE) decreases. Therefore, considering both MTF and DQE, it is preferable to satisfy $0.5 \leq \rho/p_c \leq 0.8$ as described above. It is more preferable to satisfy $0.6 \leq \rho/p_c \leq 0.8$, and further $0.7 \leq \rho/p_c \leq 0.8$.

The columnar crystals CC can be deliquescent. The protection film PF is useful for protecting the columnar crystals CC, in particular, for preventing deteriorations in the columnar crystals CC by water. A function of preventing the deteriorations by water can also be referred to as a moisture-proof function. The first protection film 102 which constitutes the protection film PF prevents the columnar crystals CC from being deteriorated by water during and after the manufacture of the scintillator 100. The second protection film 103 prevents the columnar crystals CC from being deteriorated by water after manufacturing the scintillator 100.

In manufacturing the scintillator 100, the first protection film 102 is formed so as to cover the scintillator layer 101 that includes the abnormally grown portion 104, and then the surface of the first protection film 102 can be planarized by a polishing process. The first protection film 102 is formed so as not to damage or break the scintillator layer 101 and the first protection film 102 by this polishing process. The first protection film 102 can be constituted by a resin having low water permeability. The first protection film 102 can be constituted by, for example, a general organic sealing material such as a silicone resin, acrylic resin, or epoxy resin. Alternatively, the first protection film 102 can be constituted by, for example, a hot-melt resin such as a polyester resin, polyolefin resin, or polyamide resin. Alternatively, the first protection film 102 may be constituted by an organic film such as a poly-para-xylene (parylene) or polyuria film that can be formed by a CVD deposition method. Alternatively, the first protection film 102 may be constituted by an organic film made of a fluorine-/chloride-based resin or the like which is formed from a liquid material through coating and drying steps. The first protection film 102 may be formed by another material and another method.

In particular, the first protection film 102 is preferably constituted by the poly-para-xylene film that can be formed by the CVD deposition method and has low water permeability. It is also preferable that the first protection film 102 can be coated in a liquid material state by a method such as spin coating or spray coating, and is constituted by a fluorine-based resin made of polyvinylidene fluoride or the like having low water permeability or a chloride-based resin made of polyvinylidene chloride or the like.

The first protection film 102 also has a function of entering the interspaces 106 of the plurality of columnar crystals CC, and mechanically fixing and protecting the plurality of columnar crystals CC. When the filling factor of the scintillator layer 101 is set to 0.8 or less, the mechanical strength of the scintillator layer 101 made of the plurality of columnar crystals CC may be decreased by increases in the interspaces 106. However, the first protection film 102 enters the interspaces 106 of the plurality of columnar crystals CC, thereby mechanically fixing and protecting the scintillator layer 101, thus increasing the mechanical strength of the scintillator layer 101. This prevents the scintillator layer 101 from being damaged or broken in the polishing process of the first protection film 102. Typically, the polishing process can always be executed with formation of the first protection film 102 regardless of whether the abnormally grown portion 104 exists. If the abnormally grown portion 104 exists, the front end of the abnormally grown portion 104 is removed by the polishing process, planarizing the surface of the first protection film 102.

The second protection film 103 protects the abnormally grown portion 104 and also improves the moisture-proof function of each columnar crystal CC covered with the first protection film 102. In addition to the moisture-proof function, the second protection film 103 is preferably formed by a material and a process that do not cause a characteristic degradating factor such as light scattering in the interface between the first protection film 102 and the second protection film 103. More specifically, the second protection film 103 is preferably formed by a material having a refractive index almost equal to that of the first protection film 102 and having the moisture-proof function. The second protection film 103 can be formed by the same material and the same process as the first protection film.

A final arithmetic average roughness (Ra) of the surface of the second protection film 103 is preferably smaller than an arithmetic average roughness (Ra) of the surface of the first protection film 102 after the polishing process is performed. This is effective, in the radiation imaging apparatus constituted by combining the scintillator 100 and the sensor array including a plurality of photoelectric conversion elements, in reducing light scattering in the interface between the scintillator 100 and the sensor array.

A part of the abnormally grown portion 104 may be removed by a dissolving step after the abnormally grown portion 104 is exposed by performing the polishing process on the first protection film 102 which covers the scintillator layer 101 including the abnormally grown portion 104. Then, the second protection film 103 which covers the first protection film 102 can be formed. The first protection film 102 and the second protection film 103 form the protection film PF having an integrated or layered structure. When the columnar crystals CC are mainly constituted by cesium iodide, a liquid such as water or a polar solvent can be used in the dissolving step. IPA can be given as an example of the polar solvent. The liquid can be supplied to the abnormally grown portion 104 by using, for example, a spray. Using the spray is advantageous in facilitating adjustment of a liquid supply amount, and preventing the abnormally grown portion 104 or the columnar crystals CC adjacent to it from being excessively dissolved by the excessive supply amount. The liquid can be supplied to the abnormally grown portion 104 by supplying the liquid to the entire region of the first protection film 102 on which the abnormally grown portion 104 is exposed.

The scintillator 100 may include a base 105. The scintillator layer 101 can be arranged on the base 105. The base 105 can be constituted by a material which transmits radiation sufficiently. The base 105 may include a reflection layer which reflects light converted from radiation by the scintillator layer 101. When the base 105 includes the reflection layer, a protection film which protects the reflection layer can be provided. The base 105 can be constituted by, for example, a carbon-based substrate such as an amorphous carbon substrate, a graphite substrate, or a CFRP substrate. Alternatively, the base 105 can be constituted by a metal-based substrate such as an aluminum (Al) substrate or a magnesium (Mg) substrate.

A method of manufacturing the scintillator according to the first embodiment of the present invention will be described below with reference to FIGS. 2 and 3. Note that in FIGS. 2 and 3, only a portion which constitutes a part of the scintillator 100 is shown for the sake of drawing simplicity.

First, in step S210, a developing step of developing, on the base 105, the scintillator layer 101 constituted by the plurality of columnar crystals CC is executed. The plurality of columnar crystals CC can be developed such that each front end thereof has a sharp-pointed shape. In this developing step, the abnormally grown portion 104 may be formed. The abnormally grown portion 104 can be caused, for example, when an abnormal portion such as an impurity, a foreign substance, or a scratch exists on the surface of the base 105, or a foreign substance generated by boiling a heated deposition material forms an abnormal portion on the surface of the base 105 or on each developing columnar crystal CC. That is, the abnormally grown portion 104 can be formed by abnormally growing a material for forming the scintillator layer using an abnormal portion as a nucleus.

Next, in step S220, a first protection film forming step of forming the first protection film 102 so as to cover the scintillator layer 101 is executed. In the first protection film forming step, the first protection film 102 can typically be formed such that the abnormally grown portion 104 is covered completely with the first protection film 102. In the first protection film forming step, the first protection film 102 can be formed so as to obtain a structure in which the respective sharp-pointed front ends of the plurality of columnar crystals CC stick into the first protection film 102. Typically, on the root sides (on the side of the base 105) of the columnar crystals CC, the first protection film 102 can be formed so as to leave the interspaces 106. The first protection film 102 can be formed by, for example, applying a protection film material dissolved into a volatile solvent on each scintillator layer 101 by a coating method such as spin coating or spray coating and solidifying the protection film material. Solidification of the protection film material can include a step such as annealing and drying.

Then, in steps S230 and S240, a planarizing step which includes a polishing process of polishing the first protection film 102 over the entire region of its surface is executed. The polishing process can be performed, for example, by using a lapping film, a grinder, or the like. An examining step of specifying the position of the abnormally grown portion 104 is not needed by adopting the polishing process of polishing the first protection film 102 over the entire region of its surface. It is therefore possible to simplify a manufacturing method and decrease a manufacturing cost.

In the polishing process of polishing the first protection film 102 over the entire region of its surface, first, the abnormally grown portion 104 is polished prior to another portion as schematically shown as step S230. Then, the first protection film 102 is polished over the entire region as schematically shown as step S240. In the polishing process, the front end of the abnormally grown portion 104 is polished as well as the surface of the first protection film 102 so as to form a continuation surface by the surface of the first protection film 102 and the surface of the abnormally grown portion 104.

The polishing process in the planarizing step of steps S230 and S240 can be executed so as to, for example, form a plane by the exposed surface of the first protection film 102 polished by the polishing process and the exposed surface of the abnormally grown portion 104 polished by the polishing process. The planarizing step in steps S230 and S240 may further include a removing process of removing chips generated by the polishing process by gas blowing (for example, nitrogen gas blowing).

Then, in step S250, a second protection film forming step of forming the second protection film 103 which covers the first protection film 102 that has undergone the planarizing step in steps S230 and S240 is executed. The second protection film 103 can be formed by a different material and/or process from the material and/or the process which forms the first protection film 102. It is preferable, however, that the second protection film 103 is formed by the same material and/or process as the material and/or the process which forms the first protection film 102. This is advantageous in simplifying the manufacturing method, in addition to advantageous in preventing light scattering or the like in the interface between the first protection film 102 and the second protection film 103.

Figure 4:
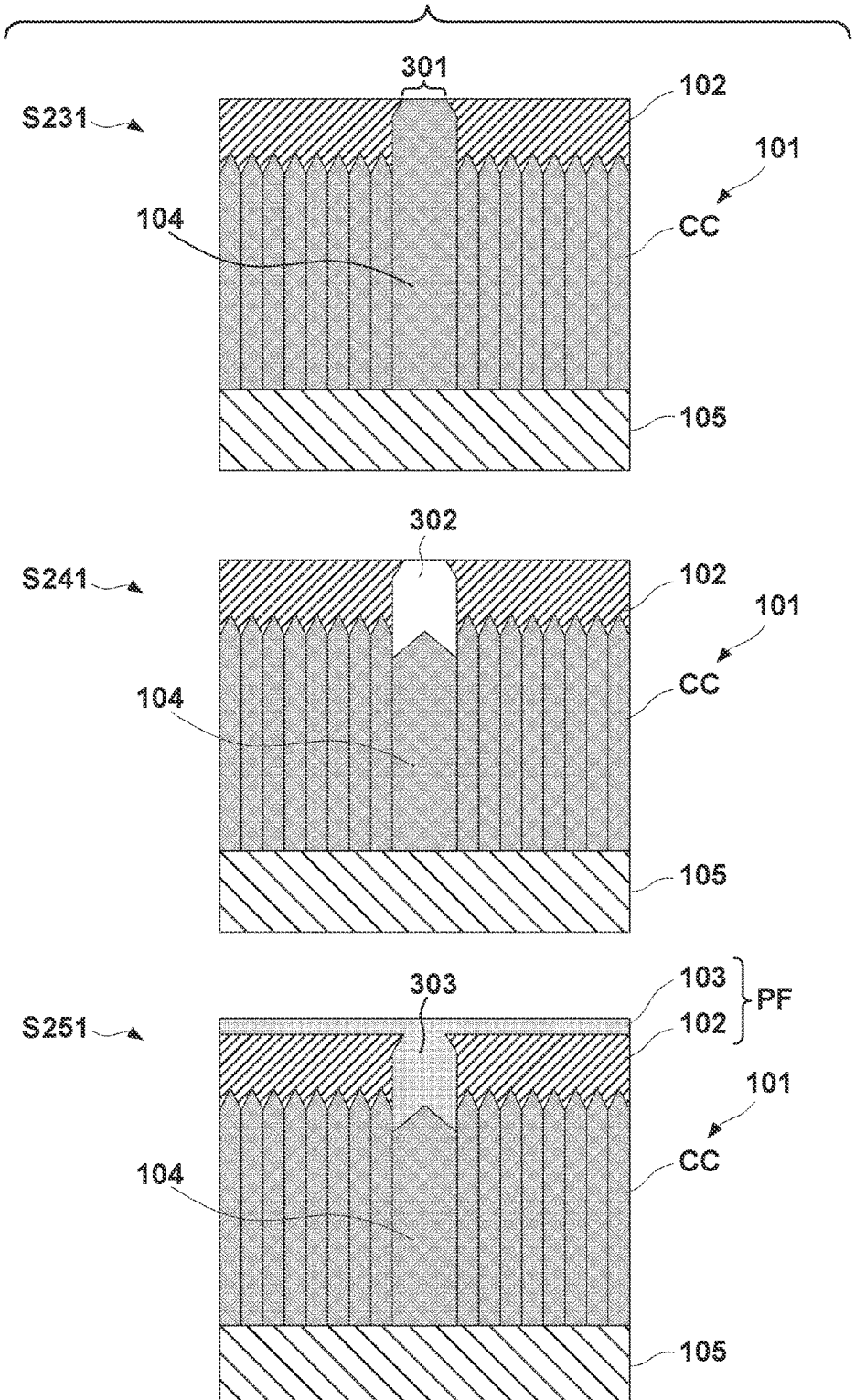
FIG. 4 shows views for explaining the method of manufacturing the scintillator according to the second embodiment of the present invention.

The method of manufacturing the scintillator according to the first embodiment of the present invention will be described below with reference to FIGS. 2 and 4. Note that in FIGS. 2 and 4, the portion which constitutes the part of the scintillator 100 is shown for the sake of drawing simplicity. The second embodiment can be common to the first embodiment for steps S210 and S220 shown in FIG. 2.

Following step S220, a processing step which includes steps S231 and S241 is executed. First, in step S231, a planarizing step which includes a polishing process of polishing a first protection film 102 over the entire region of its surface is executed. An examining step of specifying the position of an abnormally grown portion 104 is not needed by adopting the polishing process of polishing the first protection film 102 over the entire region of its surface. It is therefore possible to simplify a manufacturing method and decrease a manufacturing cost. A polishing amount obtained by the polishing process can be decided such that the front end of the abnormally grown portion 104 is exposed, and more specifically, an opening 301 which exposes the front end of the abnormally grown portion 104 is formed on the first protection film 102. The polishing amount obtained by the polishing process may be a polishing amount decided in advance or may be decided by monitoring exposure of the front end of the abnormally grown portion 104. However, the former is more advantageous in terms of an increase in throughput. The polishing amount in the former can be decided through an experiment. This experiment can be performed, for example, by using a microscope such as an optical microscope, a laser microscope, or a SEM. Monitoring in the latter can be performed, for example, by using the microscope such as the optical microscope or the laser microscope.

The polishing process in the planarizing step of step S231 can be executed so as to, for example, form a plane by the exposed surface of the first protection film 102 polished by the polishing process and the exposed surface of the abnormally grown portion 104 polished by the polishing process. The planarizing step in step S231 may further include a removing process of removing chips generated by the polishing process by gas blowing (for example, nitrogen gas blowing). The polishing process can be performed, for example, by using a lapping film, a grinder, or the like.

Then, in step S241, a dissolving step of dissolving a part of the abnormally grown portion 104 whose front end is polished by the polishing process in the planarizing step of step S231 is executed. When columnar crystals CC are mainly constituted by CsI, the abnormally grown portion 104 whose front end is polished by the polishing process in the planarizing step of step S231 is dissolved by using, for example, water or a polar solvent in the dissolving step. IPA can be given as an example of the polar solvent. A liquid can be supplied to the abnormally grown portion 104 by using, for example, a spray. Using the spray is advantageous in facilitating adjustment of a liquid supply amount, and preventing the abnormally grown portion 104 or the columnar crystals CC adjacent to it from being excessively dissolved by the excessive supply amount. The liquid can be supplied to the abnormally grown portion 104 by supplying the liquid to the entire region of the first protection film 102 on which the abnormally grown portion 104 is exposed. In deciding a condition for the dissolving step in step S241, dissolution of the abnormally grown portion 104 can be observed by a microscope such as a SEM. A cavity 302 is formed by dissolving the part of the abnormally grown portion 104.

Then, in step S251, a second protection film forming step of forming a second protection film 103 which covers the first protection film 102 that has undergone the dissolving step in step S241 is executed. In the second protection film forming step, a filling portion 303 can be formed by filling the cavity 302 as a whole or partially with the second protection film 103. The second protection film 103 can be formed by a different material or process from a material and/or a process which forms the first protection film 102. It is preferable, however, that the second protection film 103 is formed by the same material and/or process as the material and/or the process which forms the first protection film 102. This is advantageous in simplifying the manufacturing method, in addition to advantageous in preventing light scattering or the like in the interface between the first protection film 102 and the second protection film 103.

The scintillator manufactured by the above-described manufacturing method includes scintillator layer 101 constituted by the plurality of columnar crystals and a protection film PF (102 and 103) which covers the scintillator layer 101. The scintillator layer 101 includes the abnormally grown portion 104, and the plurality of columnar crystals CC which constitute a normally grown portion. The abnormally grown portion 104 is lower than the normally growing portion. The second protection film 103 has the opening 301 in a region on the abnormally grown portion 104. The second protection film 103 may reach the abnormally grown portion 104 by penetrating the first protection film 102 via the opening 301.

Figure 5:
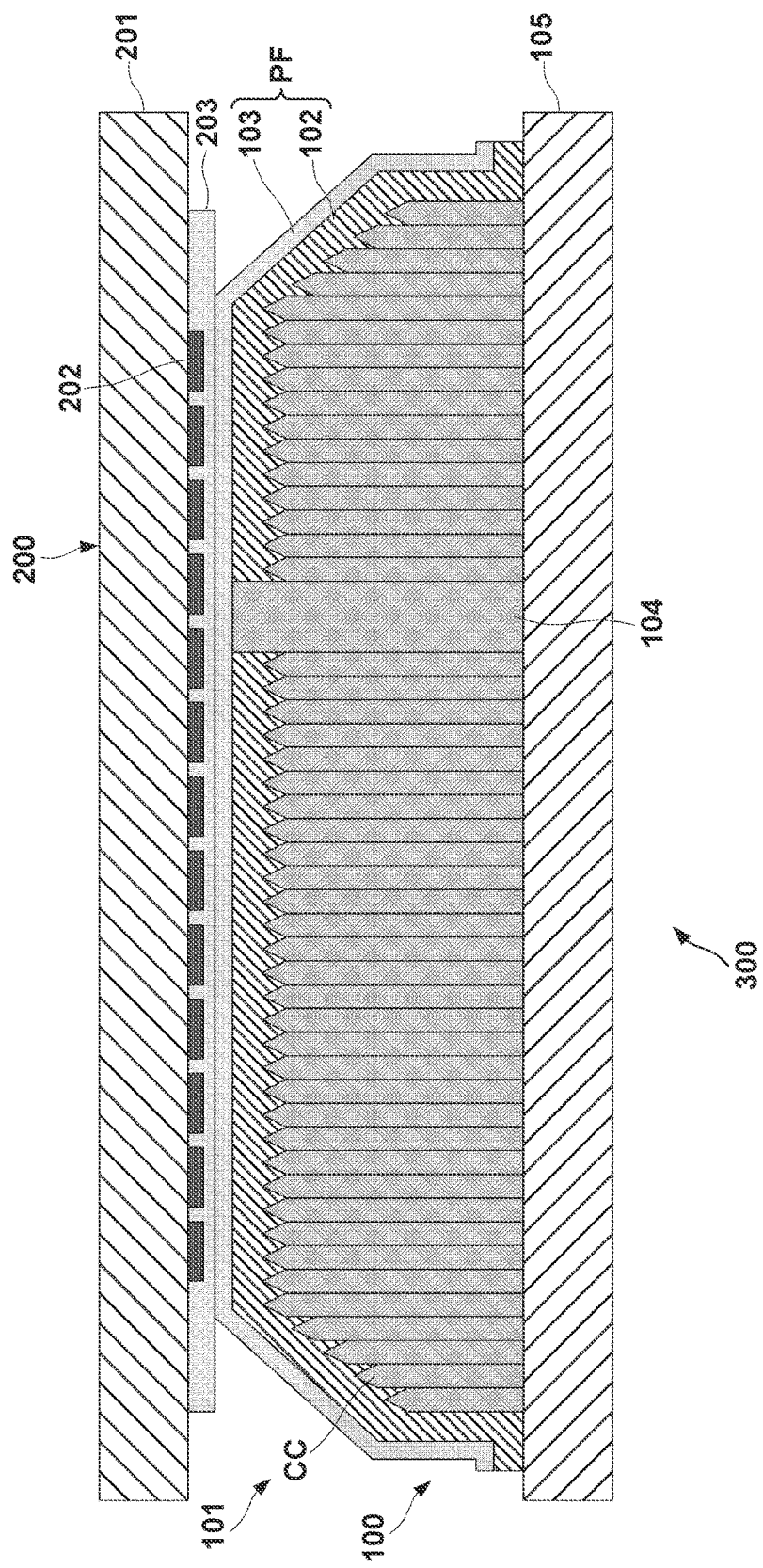
FIG. 5 is a view showing the first arrangement example of a radiation imaging apparatus according to the present invention.

FIG. 5 shows the first arrangement example of a radiation imaging apparatus 300 including the scintillator 100 formed by the first or second embodiment. The radiation imaging apparatus 300 includes the scintillator 100 and a sensor array 200 including a plurality of photoelectric conversion elements 202 which photoelectrically convert light converted from radiation by the scintillator 100. The sensor array 200 can include a substrate 201, the plurality of photoelectric conversion elements 202 arrayed on the substrate 201, and a protection film 203 which covers the plurality of photoelectric conversion elements 202. FIG. 5 describes the arrangement of the scintillator 100 according to the first embodiment. However, this arrangement can be replaced by the arrangement of the scintillator 100 according to the second embodiment.

Figure 6:
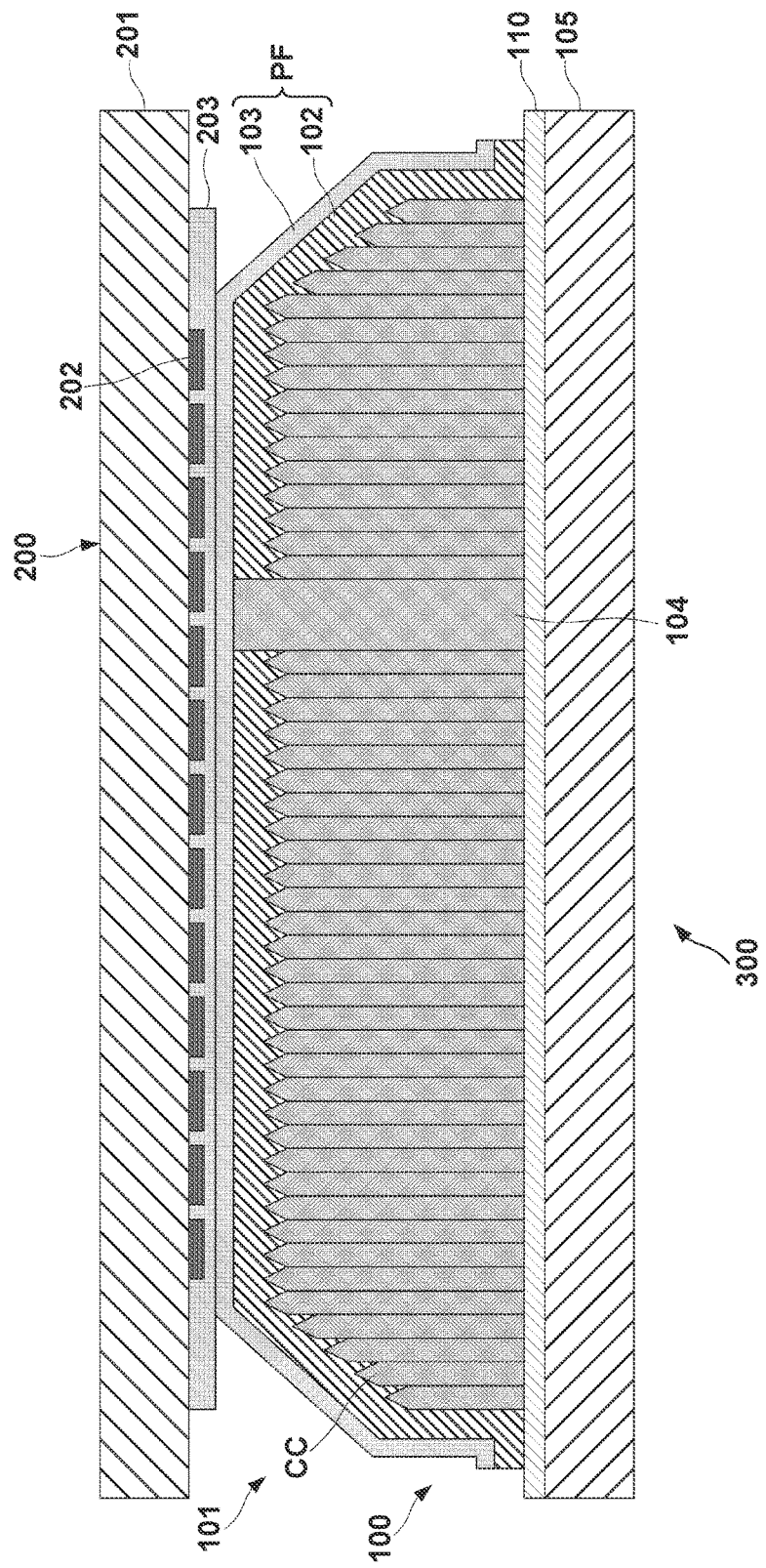
FIG. 6 is a view showing the second arrangement example of a radiation imaging apparatus according to the present invention.

FIG. 6 shows the second arrangement example of a radiation imaging apparatus 300 including the scintillator 100 formed by the first or second embodiment. The second arrangement example is different from the first arrangement example in that the scintillator 100 includes the base 105 including a reflection layer 110. In Example 2, another arrangement can comply with the arrangement in the first arrangement example.

Figure 7:
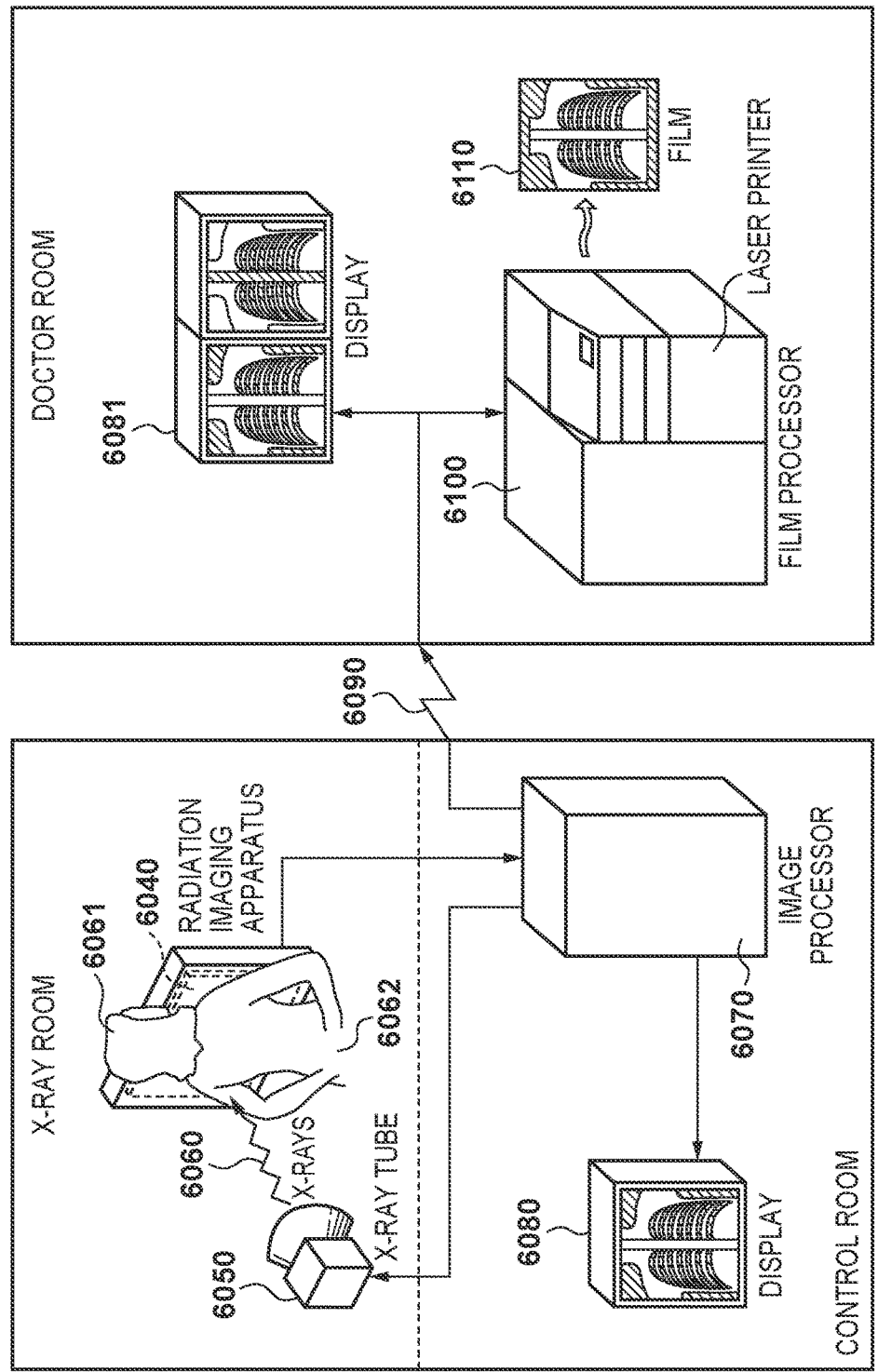
FIG. 7 is a view exemplifying a radiation imaging system.

FIG. 7 shows an example of the arrangement of a radiation imaging system as an application of the radiation imaging apparatus 300. X-rays (radiation) 6060 generated by an X-ray tube (radiation source) 6050 pass through a chest 6062 of a patient or an object 6061 and enter a radiation imaging apparatus 6040 like the radiation imaging apparatus 300 as exemplified in FIG. 5 or 6. The X-rays that have entered include the internal information of the object 6061. The scintillator emits light as X-rays enter, and the photoelectric conversion elements of the sensor array photoelectrically convert this, obtaining electrical information. This information can be converted into digital data, an image processor 6070 can perform image processing on the digital data, and the resultant data can be observed on a display 6080 in a control room. This information can be transferred to a remote place by a transmission unit like a network 6090 such as a telephone, a LAN, or the Internet. Consequently, the information can be displayed on a display 6081 in another place such as a doctor room or saved in a recording unit such as an optical disk. Therefore, it is also possible for a doctor in a remote place to perform diagnosis. The information can also be recorded on a film 6110 by a film processor 6100 serving as another recording unit.

Example 1 obtained by further embodying the first embodiment and Example 2 obtained by further embodying the second embodiment will be described below.

Example 1

First, a base 105 including an aluminum reflection layer was prepared, and scintillator layer 101 was formed on the base 105. CsI:Tl was used as a material of the scintillator layer 101. The scintillator layer 101 was formed by vapor deposition. Note that deposition parameters such as a deposition temperature, a pressure, and the distance between a deposition source and the base 105 were set such that the filling factor of the scintillator layer 101 became equal to or less than 0.8. For example, it was possible to set the deposition temperature to a range of 80° C. to 210° C., and the deposition pressure to a range of 0.001 to 1.0 Pa.

A region of the center portion 2×2 cm of each scintillator layer 101 formed by the above-described method was cut out as a sample. The volume of the region was obtained from a film thickness, and a filling factor was obtained from the volume and the weight of the region. As a result, the film thickness of 800 µm and the filling factor of 0.76 were obtained. Columnar crystals were seen by observing the surface of the sample after measurement with a scanning electron microscope (SEM).

Then, a first protection film 102 was formed on the scintillator layer 101. More specifically, as the first protection film 102, a polyvinylidene chloride (PVDC) film was formed by spray coating. Polyvinylidene chloride used cyclopentanone as a solvent, and coating was performed at a concentration of 5 wt %. Coating was performed while heating a workpiece installation stage to 80° C., and drying was performed simultaneously with coating.

After coating, it was confirmed that the polyvinylidene chloride film was formed so as to cover the columnar crystals by observing a sample manufactured on the same condition with the SEM. It was also confirmed that polyvinylidene chloride entered interspaces between the columnar crystals. Polyvinylidene chloride entered into a position on an average of about 20 μm away from the front end of each columnar crystal. A polyvinylidene chloride film was formed up to a position of about 5 μm measured away from the front end of each columnar crystal. A portion on an abnormally grown portion 104 was also covered with the polyvinylidene chloride film.

Then, the polyvinylidene chloride film serving as the first protection film 102 formed on the scintillator layer 101 and the abnormally grown portion 104 were planarized by a polishing process. Lapping films (lapping film sheets available from Sumitomo 3M) were used for the polishing process. Two types of films having mesh #4000 (granularity 3 μm) and mesh #2000 (granularity 9 μm) were used as the lapping films. First, the abnormally grown portion 104 was preferentially polished by the film having mesh #2000. Next, the entire region of the first protection film 102 was polished together with the abnormally grown portion 104 by using the film having mesh #4000. Finally, dust produced in polishing was removed by nitrogen blowing or the like.

By SEM observation of an observation sample manufactured on the same condition after polishing, a state could be confirmed in which the abnormally grown portion 104 and the first protection film 102 were polished and planarized as shown in step S240. At this time, the surface roughness (Ra) of 1.18 μm was measured by a laser microscope (shape analysis laser microscope VK-X series available from Keyence).

Then, a second protection film 103 was formed. Like the first protection film 102, polyvinylidene chloride was selected as the second protection film 103 and coating was similarly performed by spray coating. Coating was performed while heating the workpiece installation stage to 80° C. at the time of execution of spray coating. After coating, the scintillator was removed, and baked separately in $N_2$ at 90° C. for 24 h.

By checking the observation sample manufactured on the same condition, a state could be confirmed in which a polyvinylidene chloride film serving as the second protection film 103 covered the surfaces of the abnormally grown portion 104 and the surface of the first protection film 102 as shown in step S250. The clear boundary between the first protection film 102 and the second protection film 103 was not confirmed. The thickness of a protection film PF obtained by combining the first protection film 102 and the second protection film 103 was about 13 μm. Finally, the surface roughness (Ra) measured by the aforementioned method was 0.79.

A scintillator 100 thus manufactured was bounded to a sensor array 200 on an adhesive layer, manufacturing a radiation imaging apparatus 300. This radiation imaging apparatus 300 had good DQE and MTF.

Example 2

In Example 2, in addition to the method in Example 1 and removal of an abnormally grown portion 104 by polishing, the abnormally grown portion 104 was removed by dissolving, and then a second protection film 103 was formed, obtaining a scintillator 100.

First, a scintillator layer 101 and a first protection film 102 were formed by the same method as in Example 1. Then, the first protection film 102 was polished by using a polishing sheet (lapping film) used in Example 1. A lapping film having #2000 was used in this polishing. At this time, a polishing amount was adjusted in advance so as to polish only a portion of the first protection film 102 on the abnormally grown portion 104. With this polishing, a minute opening 301 was formed only in the portion of the first protection film 102 on the abnormally grown portion 104. This state was confirmed by a laser microscope and SEM observation.

Then, a liquid that dissolves CsI was applied on the first protection film 102. In this example, IPA (Isopropyl Alcohol) was selected as the liquid that dissolved CsI. A small amount of IPA was sprayed onto the first protection film 102 by spray coating. At this time, a stage on which the scintillator 100 was installed was heated to 80° C. With this temperature setting, IPA after coating was dried immediately, and dissolution of CsI more than necessary was prevented.

By performing SEM analysis of the sample manufactured on the same condition, a state could be confirmed in which CsI was dissolved locally only in the upper portion of the abnormally grown portion 104 as shown in step S241.

Then, the second protection film 103 was formed by the same method as in Example 1. By checking a structure with the observation sample, it was confirmed that a filling portion 303 obtained by partially filling a cavity 302 with the second protection film 103 was formed, and also the second protection film 103 was formed uniformly on the first protection film 102 as shown in step S251.

The scintillator 100 thus manufactured was bounded to a sensor array 200 on an adhesive layer, manufacturing a radiation imaging apparatus 300. This radiation imaging apparatus 300 had good DQE and MTF.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-156239, filed Aug. 6, 2015, which is hereby incorporated by reference herein in its entirety.

What is claimed is:

1. A method of manufacturing a scintillator, the method comprising:

growing a scintillator layer constituted by a plurality of columnar crystals on a base;

forming a first protection film so as to cover the scintillator layer;

planarizing the first protection film, the planarizing including a polishing process of polishing an entire surface region of the first protection film; and forming a second protection film configured to cover the first protection film that has undergone the planarizing, wherein the scintillator layer grown on the base includes an abnormally grown portion, and in the polishing process, a front end of the abnormally grown portion is polished as well as the entire surface region of the first protection film without specifying a position of the abnormally grown portion.

2. The method according to claim 1, wherein the scintillator layer grown on the base includes a normally grown portion, and wherein the polishing process is executed such that the front end of the abnormally grown portion is polished, but the normally grown portion is not polished, and a plane is formed by an exposed surface of the first protection film polished by the polishing process and an exposed surface of the abnormally grown portion polished by the polishing process.

3. The method according to claim 1, wherein respective front ends of the plurality of columnar crystals are pointed, and in the forming the first protection film, the first protection film is formed such that a structure in which the respective front ends of the plurality of columnar crystals stick into the first protection film is obtained.

4. The method according to claim 1, further comprising, after the planarizing and before the forming the second protection film, dissolving a part of the abnormally grown portion having a front end polished by the polishing process.

5. The method according to claim 4, wherein the plurality of columnar crystals are constituted by cesium iodide as a main component and in the dissolving, the part of the abnormally grown portion having the front end polished by the polishing process is dissolved by using one of water and a polar solvent.

6. The method according to claim 1, wherein the planarizing further includes a removing process of removing chips generated by the polishing process by gas blowing.

7. The method according to claim 1, wherein a material of the first protection film and a material of the second protection film are the same.

8. The method according to claim 1, wherein an arithmetic average roughness (Ra) of a surface of the second protection film is smaller than an arithmetic average roughness (Ra) of a surface of the first protection film after the polishing process is performed.

9. The method according to claim 1, wherein $0.5 \leq \rho/p_c \leq 0.8$, where $\rho(g/cm^3)$ is a density of the scintillator layer and $p_c(g/cm^3)$ is a density of a material of the scintillator layer in a single crystal state.

10. The method according to claim 1, wherein the scintillator layer grown on the base includes a normally grown portion, and wherein the polishing process is executed such that the front end of the abnormally grown portion is polished, but the normally grown portion is not polished, and a region of the first protection film under the surface region of the first protection film remains after the polishing process.

11. The method according to claim 1, wherein the scintillator layer grown on the base includes a normally grown portion, wherein the polishing process is executed such that the front end of the abnormally grown portion is polished, but the normally grown portion is not polished, and an exposed surface of the abnormally grown portion is formed, and wherein the first protection film remains on a region of the scintillator layer other than the abnormally grown portion.

12. A method of manufacturing a scintillator, the method characterized by comprising:

growing a scintillator layer constituted by a plurality of columnar crystals on a base;

forming a first protection film so as to cover the scintillator layer;

polishing an entire surface region of the first protection film without specifying a position of the abnormally grown portion, such that a part of an abnormally grown portion included in the scintillator layer is exposed;

dissolving the part of the abnormally grown portion exposed by the polishing the first protection film;

forming a second protection film configured to cover the first protection film after the dissolving.

13. The method according to claim 12, wherein the scintillator layer grown on the base includes a normally grown portion, and wherein the polishing is executed such that the front end of the abnormally grown portion is polished, but the normally grown portion is not polished, and a region of the first protection film under the surface region of the first protection film remains after the polishing.

14. The method according to claim 12, wherein the scintillator layer grown on the base includes a normally grown portion, wherein the polishing is executed such that the front end of the abnormally grown portion is polished, but the normally grown portion is not polished, and an exposed surface of the abnormally grown portion is formed, and wherein the first protection film remains on a region of the scintillator layer other than the abnormally grown portion.

* * * * *